United States Patent
Huang et al.

(10) Patent No.: US 6,783,057 B2
(45) Date of Patent: Aug. 31, 2004

(54) ANTI-TOMBSTONING SOLDER ALLOYS FOR SURFACE MOUNT APPLICATIONS

(75) Inventors: Benlih Huang, New Hartford, NY (US); Ning C. Lee, New Hartford, NY (US)

(73) Assignee: Indium Corporation of America, Utica, NY (US)

( * ) Notice: Subject to any disclaimer, the term of this patent is extended or adjusted under 35 U.S.C. 154(b) by 129 days.

(21) Appl. No.: 09/957,196

(22) Filed: Sep. 20, 2001

(65) Prior Publication Data

US 2002/0063147 A1 May 30, 2002

Related U.S. Application Data

(60) Provisional application No. 60/241,498, filed on Oct. 18, 2000.

(51) Int. Cl.[7] .............................................. B23K 31/00
(52) U.S. Cl. ..................... 228/248.1; 228/245; 420/557
(58) Field of Search ......................... 228/248.1, 180.22, 228/248.2

(56) References Cited

U.S. PATENT DOCUMENTS

| | | | | |
|---|---|---|---|---|
| 5,514,912 A | * | 5/1996 | Ogashiwa | 228/180.5 |
| 5,690,890 A | * | 11/1997 | Kawashima et al. | 420/559 |
| 6,050,480 A | | 4/2000 | Taguchi et al. | 228/248.1 |
| 6,054,653 A | * | 4/2000 | Hansen et al. | 174/261 |
| 2002/0005588 A1 | * | 1/2002 | Kimoto et al. | 257/772 |

FOREIGN PATENT DOCUMENTS

| JP | 10175093 | 6/1998 |
|---|---|---|
| JP | 11207493 | 8/1999 |
| JP | 11340005 | 10/1999 |

OTHER PUBLICATIONS

*High Speed Printing, No Clean Solder Pastes With 'Anti-Tombstoning' Option*, Multicore, www.multicore.com, RP15, Fastprint 100, 3 pages.

*Finding the Miracle Cure for tombstoning*, Peter Biocca, EP&P, Oct. 1999, 3 pages.

*Solder paste overcomes tombstoning problems*, Senju Europe, Apr. 2000, pp. 1–7.

*Deformation Modeling Applied to Stress Relaxation of Four Solder Alloys*, Rohde, et al, Sandia Laboratories, Apr. 1980, vol. 102, pp–207–214.

*A Benchmark Process For the Lead–Free Assemnly of Mixed Technology PCB's*, Christ Bastecki, Revised Sep. 1999, pp. 1–12, Alpha Metals Website, www.alphametals.com.

*Development And Validation Of A Lead–Free Alloy*, Laine Ylijoki, et al., vol. 2, Issue 1, 1997, pp. 183–185.

*Lead Free Soldiers For electronic Assembly*, Vincent et al., GEC Journal of Research, vol. 11, No. 2, 1994, pp. 2–15.

*Joint Industry Standard, Requirements for Electronic Grade Solder Alloys and Fluxed and Non–Fluxed Solid Solders for Electronic Soldering Applications*, American National Standard, ANSI/J–STD–006, Jan. 1995.

* cited by examiner

Primary Examiner—Tom Dunn
Assistant Examiner—Colleen P. Cooke
(74) Attorney, Agent, or Firm—Weingarten, Schurgin, Gagnebin & Lebovici LLP

(57) ABSTRACT

The object of this invention is to employ a solder alloy comprising tin/lead/silver in order to provide a wider solidification range and achieve balance between the surface tensions of both side of a small leadless component. The expanded solidification range slows the melting and wetting time so as to balance the surface tension of the molten solder, and in turn reduces the tombstoning frequency. The preferred Ag concentration is 0.2–0.5% in weight, the more preferred Ag concentration is 0.3–0.4% in weight. For reflow soldering of small leadless components, the pastes made with the alloy compositions of Sn62.6Pb37Ag0.4 and Sn63Pb36.6Ag0.4 results in improvements in tombstoning.

2 Claims, No Drawings

ANTI-TOMBSTONING SOLDER ALLOYS FOR SURFACE MOUNT APPLICATIONS

CROSS REFERENCE TO RELATED APPLICATIONS

This application claims priority from U.S. Provisional Application Ser. No. 60/241,498, filed Oct. 18, 2000, which is incorporated in its entirety herein.

STATEMENT REGARDING FEDERALLY SPONSORED RESEARCH OR DEVELOPMENT

N/A

BACKGROUND OF THE INVENTION

Tombstoning effect (also known as Manhattan effect, Drawbridge effect, or Stonehenge effect) is considered a common soldering defect in surface mount electronic assembly of small leadless components such as resistors and capacitors. Recently, the trend toward miniaturization in electronic assembly to achieve smaller, lighter, and higher performing products has resulted in rapidly increasing implementation of small leadless passive and active components. Until recently, the 0603 components (this terminology means that the components are 6 mil×3 mil in size), which have been prevalent for years in high volume production, have produced very high yield and few defects. The 0402 and 0201 components have recently been used more frequently and have presented electronic assemblers the tremendous challenge of decreasing the defects due to increasing use of these components in assembly.

The tombstoning effect is due to the imbalance of the surface tension of the molten solder at both ends of the component during reflow soldering. Because of the small dimensions of these 0402 and 0201 components, the intricate balance of the surface tension may be more easily disturbed by either the change of the solderability of the components or by the differences of time at which the solder paste at each end of the component begins to melt.

One approach to solving the tombstoning problem has been proposed by Taguchi et al (U.S. Pat. No. 6,050,480), which teaches using a solder powder comprising of a solder alloy consisting of 60–65% Sn, 0.1–0.6% Ag, 0.1–2%Sb, and a balance of Pb, to prevent tombstoning during reflow soldering. The essence of Taguchi is to employ Ag and Sb to effectively increase the solidification temperature range and, in turn, to prevent the tombstoning.

BRIEF SUMMARY OF THE INVENTION

The object of this invention is to employ a solder alloy comprising tin/lead/silver in order to provide a wider solidification range and achieve balance between the surface tension of both side of a small leadless component. The expanded solidification range slows the melting and wetting time so as to balance the surface tension of the molten solder, and in turn reduces the tombstoning frequency. The preferred Ag concentration is 0.2–0.5% in weight, while the more preferred Ag concentration is 0.3–0.4% in weight. For reflow soldering of small leadless components, the pastes made with the alloy compositions of Sn62.6Pb37Ag0.4 and Sn63Pb36.6Ag0.4 result in minimization of tombstoning.

DETAILED DESCRIPTION OF THE INVENTION

It has been discovered that the addition of a small amount of silver to a tin/lead solder composition can dramatically reduce the tombstoning, particularly with the extremely small electronic components that have recently been used in electronic assemblies. In particular, it has been found that the amount of silver should be in the range of 0.1–0.7%, preferably 0.2–0.5% (for a tin/lead alloy in the range of approximately Sn63Pb37), more preferably 0.3–0.4%.

This unexpected benefit has been found in solders where the tin content ranges from about 58.0–68.0% (preferably 61.0–65.0% and most preferably 62.0–64.0%), while the lead content can range from about 32.0–42.0% (preferably 35.0–39.0% and most preferably 36.0–38.0%). (Note: it is recognized that, in these three-component tin/lead/silver solders, the maximum amount of each of the three components cannot be used, since the total must not exceed 100%.)

Thus, preferred alloys have been found to be the compositions
a. Sn62.6Pb37Ag0.4,
b. Sn63Pb36.6Ag0.4,
c. Sn62Pb37.6Ag0.4,
d. Sn62.2Pb37.4Ag0.4

In addition, it has been found that deviations from the desired silver content of 0.3–0.4% has resulted in increased tombstoning, as shown in the following table 1. In this test a rosin mildly activated flux was used, the metal load was 90%, and the powder size of the Sn63Pb37 powder was 45–25 microns (i.e., particles passed through 325 mesh, but failed to pass through 500 mesh screens). (Note: this test employs somewhat exaggerated conditions. Under these test conditions, the acceptable range of silver is from 0.1–0.5%. Under normal (i.e., non-test) conditions, we have found acceptable performance using 0.1–0.7% silver.)

TABLE 1*

| Ag concentration (weight %) | Tombstoning frequency |
|---|---|
| 0 | 33% ± 15% |
| 0.1 | 8% ± 6% |
| 0.4 | 0% ± 3% |
| 0.6 | 31% ± 19% |

*Because a manual process for vapor phase reflow was employed, relatively large data scattering was observed.

In addition it has been found that Sb does not help reduce the tombstoning frequency. Taguchi teaches using amounts of Ag (0.1–0.6%) and Sb (0.1–2%) to reduce the tombstoning frequency. Note that Taguchi indicates that the presence of less than 0.1% of either of these metals will result in the loss of the antitombstoning benefit. However, in the instant invention, it has been found that the Sb is not needed to reduce tombstoning. (Note that, in analyzing the alloys in the instant invention, only a slight contaminant level of Sb (less than 0.01%) was found.)

Further investigations of the effect of elements such as Ag, Bi, In, Sb, Zn, Cu, and Ge on the expansion of the solidification range of the Sn63Pb37 are tabulated as follows:

TABLE 2

| Alloys | Lower end of melting region | Upper end of melting region | Solidification range ° C. |
|---|---|---|---|
| Sn63Pb37 | 181.9 | 184.7 | 2.8 |
| Sn62.6Pb37Ag0.4 | 177.7 | 184.5 | 6.8 |
| Sn62.8Pb37Bi0.2 | 181.4 | 184.3 | 2.9 |
| Sn62.6Pb37Bi0.4 | 180.8 | 185.2 | 4.4 |
| Sn62.8Pb37In0.2 | 181.3 | 184.5 | 3.2 |

TABLE 2-continued

| Alloys | Lower end of melting region | Upper end of melting region | Solidification range ° C. |
|---|---|---|---|
| Sn62.6Pb37In0.4 | 180.5 | 185.0 | 4.5 |
| Sn62.8Pb37Sb0.2 | 182.2 | 186.3 | 4.1 |
| Sn62.6Pb37Sb0.4 | 182.4 | 185.8 | 3.4 |
| Sn62.8Pb37Zn0.2 | 181.8 | 184.5 | 2.7 |
| Sn62.6Pb37Zn0.3 | 182.0 | 185.7 | 3.7 |
| Sn62.8Pb37Cu0.2 | 181.0 | 184.1 | 3.1 |
| Sn62.6Pb37Cu0.4 | 181.0 | 184.3 | 3.3 |
| Sn62.8Pb37Ge0.2 | 181.7 | 184.6 | 2.9 |
| Sn62.6Pb37Ge0.4 | 181.7 | 184.3 | 2.6 |
| Sn62.4Pb37Ge0.6 | 181.8 | 184.1 | 2.3 |

It is very clear from table 2 that the addition of 0.4% of Ag resulted in the most expansion of the solidification range (the upper end minus the lower end of the melting range), while the addition of Sb resulted in a much smaller solidification range.

Accordingly, there is little benefit of employing Sb in antitombstoning applications.

Another benefit resulting from the exclusion of antimony is the elimination of exposure to this hazardous material. (For information on the toxicity of Sb and the gastrointestinal and respiratory effect of Sb on humans, see Antimony and Compounds, United States Environmental Protection Agency, Office of Air Quality Planning and Standards. Unified Air Toxics Website. www.epa.gov/ttn/uatw/hlthef/antimony.html.)

Furthermore, the inclusion of one fewer component certainly results in simplification and reduction in cost of the manufacturing and quality control processes. In addition, it is well known that use of more complex alloys (greater than 3 elements) generally results in significant variations of alloy compositions of solder joints. (Chris Bastecki, "A Benchmark Process for the Lead-free Assembly of Mixed Technology PCB's " Revised 1999, Alpha Metals website, www.alphametals.com)

In a more severe case, a larger pasty range (resulting from an alloy with more than 3 components) could result in "hot tearing" as the solder joints experience thermal excursions. Furthermore, it was also observed that in order to avoid the formation and segregation of low melting point phases, which could cause cracking or hot tearing, the alloy composition should be as close to a eutectic as possible. (Tommi Laine-Ylijorki, Atso Forsten, and Dr. Hector Steen, "Development and Validation of a Lead-free Alloy for Solder Paste Applications", Future Circuits International, Vol. 2, issue 1, p. 183–185.)

In addition, the solder alloys needed to be close to the eutectic composition because of smaller melting range, lower viscosity, and superior mechanical properties compared with off-eutectic compositions. (J. H. Vincent and G. Humpston, "lead-free Solders for Electronic Assembly", GEC Journal of Research, Vol. 11, No. 2, 1994, page 76.)

Multi-component doping elements added to the eutectic Sn63Pb37 composition caused greater deviation from the eutectic composition than one component, and thus suffered the above-cited weaknesses.

In the past, 0.2–0.5% Sb had been added to solders to reduce the tin pest problem, which is the allotropic transformation of beta-tin into alpha-tin at temperatures below 13° C. However, at least in Sn63Pb37 alloys, we have not observed the tin pest problem. (American National Standard, ANSI/J-STD-006 January 1995, p. 14.).

Thus, it is preferred to eliminate Sb from the alloy in order to improve performance of the solder alloy.

It is recognized that formulations similar to those disclosed herein have been described, but they are used for significantly different purposes. Rohde and Swearengen (Deformation Modeling Applied to Stress Relaxation of Four Solder Alloys", J. Eng. Materials and Technology (ASME) 102, April 1980 p. 207–214)) examined four alloys Pb50In50, Sn37.5Pb37.5In25, Sn63Pb37, and Sn62.5Pb37Ag0.5 for the purpose of obtaining parameters for establishing a stress relaxation model to describe the thermal fatigue phenomenon of solder joints between electrical component leads and printed circuit board. In contrast, anti-tombstoning alloys deal with solder joints between small leadless components and printed circuit board. Although the Sn62.5Pb37Ag0.5 is within the range of the present invention, the intended purpose of the Rohde and Swearengen's work is completely different from the present invention.

It is preferred to control the concentration of Ag to within 0.1 percent of the preferred 0.3–0.4 percent. Results have shown that at only 0.2 percent deviation from the preferred 0.4 percent Ag, the frequency of tombstoning increased at least 30%, as shown in Table 1.

The benefit of reducing tombstoning by adding silver to other tin/lead solders aside from the alloys discussed above has also been observed. However, these alloys are less frequently used for surface mount leadless components and, as a result, tombstoning is generally less of a problem for these alloys.

The following examples are intended to illustrate, but not limit, the invention.

EXAMPLE 1

Making a Solder

Soldering is an operation in which metallic parts are joined by a molten solder alloy whose melting temperature is generally below 450° C. There are great varieties of solder alloys based on tin and lead, and in electronics the solder with approximately 63% of Sn and approximately 37% of Pb is the one that is most widely used. The technique of making solder paste is to mix solder powder with flux. First, the solder alloys are produced by melting ingredient metal ingots and mixing them into solder alloys. Then, the alloys are further atomized to solder powder by either a gas atomization or centrifugal atomization process.

EXAMPLE 2

Soldering of Components

The soldering using a solder paste is called reflow soldering, which is considered the most widely employed soldering method in current electronic industries. There are generally four steps of reflow soldering. First, the solder paste (which is used to remove the metal oxide, thus allowing the solder to react with the pieces being joined; the solder paste is generally composed of metal powder plus flux or a reducing agent) is printed onto the pads on the print circuit board. Second, the components are placed on the solder paste deposits. Third, the solder paste is heated above the melting temperature of the solder alloy, and thus produces molten solder between the components and the pads. Finally, as the molten solders are cooled and solder joints are formed.

EXAMPLE 3

Tombstoning Test of Solder Pastes

The tombstoning test is performed using an exaggerated severe soldering condition to produce tombstoning. The condition is listed as follows:

(a) A 0.25 mm thick stencil is used to produce a thick deposit of solder paste. When a small component is soldered to a pad with a thick deposit of solder, the frequency of tombstoning has been found to be greater.

(b) At least 50 small passive components such as 0402 and 0201 resistors and capacitors are used.

(c) A vapor phase reflow oven is employed. The oven is full of vapor generated by heating the high boiling point fluid such as freon with coils at the bottom of the oven.

As the printed circuit board is placed in the vapor, the solder paste is heated by the hot vapor and results in soldering of the components.

(d) Following the removal of the reflowed board, the tombstoned components were counted and the percentage of tombstones with respect to the number of components placed was used for comparison.

This method has shown to be able to differentiate the tombstoning frequency of a solder paste, which has been employed for evaluating the anti-tombstoning performance of alloys with the same flux.

EXAMPLE 4

Effect of Addition of Ag Alone vs. Ag Plus Sb on Tombstoning

The tombstoning test uses 0402 surface mount components with Sn62Pb37.4Ag0.4Sb0.2 and Sn62Pb37.6Ag0.4 alloys and a rosin-based mildly activated flux (e.g., 60% Rosin, 5% dimethylamine hydrochloride, 15% glycerol, 20% Theological and other minor components). The tombstoning frequency was found to be 0% for the Sn62Pb37.4Ag0.4Sb0.2 versus 0% for the Sn62Pb37.6Ag0.4. In contrast, the Sn63Pb37 paste without any Ag or Sb doping produced 12.5% tombstoning frequency.

This example has indicated that the usage of Ag plus Sb as a dopant does not improve anti-tombstoning when compared to the usage of Ag alone.

Those with expertise in this area will recognize that variations from the invention described herein are contemplated to be within the scope of the invention.

What is claimed is:

1. A Process for reducing tombstoning in an electronic assembly comprising the usage of an anti-tombstoning solder to connect components in said assembly, comprising the steps of:

a. printing said solder onto pads on printed circuit board on said assembly, b. placing said components on said printed solder, c. heating said solder above its melting temperature to produce molten solder between said components and said pads, and d. allowing said molten solder to cool and form solder joints, wherein said solder is selected from the group consisting of a. Sn62.6Pb37Ag0.4, b. Sn63Pb36.6Ag0.4, c. Sn62Pb37.6Ag0.4, and d. Sn62.2Pb37.4Ag0.4.

2. An antitombstoning solder wherein said solder is Sn62Pb37.6Ag0.4.

* * * * *

UNITED STATES PATENT AND TRADEMARK OFFICE
CERTIFICATE OF CORRECTION

PATENT NO. : 6,783,057 B2
DATED : August 31, 2004
INVENTOR(S) : Huang et al.

It is certified that error appears in the above-identified patent and that said Letters Patent is hereby corrected as shown below:

Title page,
Item [*] Notice, delete the phrase "by 129 days" and insert -- by 38 days --

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,783,057 B2
DATED : August 31, 2004
INVENTOR(S) : Benlih Huang et al.

It is certified that error appears in the above-identified patent and that said Letters Patent is hereby corrected as shown below:

Column 5,
Line 32, "Theological" should read -- rheological --.

Signed and Sealed this

First Day of November, 2005

JON W. DUDAS
*Director of the United States Patent and Trademark Office*